United States Patent [19]
Tai

[11] Patent Number: 5,995,028
[45] Date of Patent: Nov. 30, 1999

[54] CIRCUIT FOR REMOVING BUBBLE ERRORS OCCURRING IN THERMAL CODES

[75] Inventor: Jy-Der David Tai, Hsin-Chu, Taiwan

[73] Assignee: Powerchip Semiconductor Corp., Hsin-Chu, Taiwan

[21] Appl. No.: 09/022,857

[22] Filed: Feb. 12, 1998

[51] Int. Cl.[6] .................................................. H03M 9/00
[52] U.S. Cl. ........................... 341/100; 341/160; 341/101
[58] Field of Search ................................... 341/118, 120, 341/119, 100, 101, 160

[56] References Cited

U.S. PATENT DOCUMENTS

| | | | |
|---|---|---|---|
| 5,155,489 | 10/1992 | Gulczynski | 341/160 |
| 5,252,974 | 10/1993 | Gulczynski | 341/141 |
| 5,410,677 | 4/1995 | Roskowski et al. | 395/500 |
| 5,606,317 | 2/1997 | Cloonan et al. | 341/58 |

OTHER PUBLICATIONS

Yuji Gendai, et al., IEEE International Solid State Circuits Conference/Paper TP 10.5/ pp. 172–173/ Feb. 14, 1991/"An 8b 500 MHz ADC".

Bang–Sup Song, et al. "A 10–b 15–MHz CMOS Recycling Two–Step A/D Converter," IEEE Journal of Solid State Circuits, vol. 25, No. 6, pp. 1328–1338, Dec. 1990.

*Primary Examiner*—Brian Young
*Assistant Examiner*—Peguy Jean Pierre
*Attorney, Agent, or Firm*—Ladas & Parry

[57] ABSTRACT

An electronic circuit can eliminate bubble errors by means of transferring a thermal code from spatial domain to time domain, and then from the time domain to the spatial domain. In accordance with the present invention, a rotator and a shift register are used to implement the circuit. The rotator is utilized to convert the data bits of the thermal code available in parallel into a serial thermal code. In other words, the data bits can be read serially at the output of the rotator. However, the serial thermal code is applied to the shift register for removing the bubble errors in response to the logic state in the serial thermal code and converting the serial thermal code into a corrected thermal code in parallel form. Accordingly, the electronic circuit for removing bubble errors according to the present can eliminate bubble errors occurring in the thermal code even if the bubbles occur randomly.

8 Claims, 4 Drawing Sheets

CIRCUIT FOR REMOVING BUBBLE ERRORS OCCURRING IN THERMAL CODES

BACKGROUND TO THE INVENTION

1. Scope of the Invention

The present invention is in the field of analog-to-digital conversion techniques. More specifically, the present invention is an electronic circuit for correcting thermal codes suffering from bubble errors.

2. Description of the Prior Art

A flash-type analog-to-digital converter (hereafter "ADC"), possesses faster ways to achieve analog-to-digital conversion than counting ADCs, successive-approximation ADCs, or ratiometric ADCs. The flash-type ADC is also described as a "parallel-comparator ADC" for the reason that several comparators are used to make parallel comparisons with a number of different reference voltages respectively. In recent years, because the fully parallel ADC makes great demands for layout area and power consumption, subranging two-step conversion architectures, which divide one comparison process into a coarse decision cycle and a fine decision cycle, have been developed. See B. S. Song et al., "A 10-b 15-MHz CMOS RECYCLING TWO-STEP A/D CONVERTER," $IEEE$ $Journal$ $of$ $Solid$-$State$ $Circuits$, vol.25, No.6, December 1990, pp.1328–1338. The two-step ADC trades speed for smaller layout area and lower power consumption, and it also has the potential for high-resolution applications.

Normally, the outputs of comparators in the flash-type ADC form a thermal code. Then, a priority encoder is used to convert the thermal code into a binary code or a binary-coded-decimal (BCD) code for further processing. The thermal code must satisfy high resolution requirements, but this makes it susceptible to process variation or noise interference, and thus it suffers from bubble errors. The bubble is an output code quite deviant from the input value which occurs sporadically. For example, a 10-bit two-step ADC with a reference range of 2 V needs to differentiate about 2 mV ($2$ $V/2^{10}$) prior to the generation of the thermal code. Such tiny voltage difference makes the outputs of comparators quite sensitive to process variation and noise interference. For instance, noise may be induced and so interfere with the outputs of the comparators while the comparators are activated simultaneously.

To overcome the aforementioned problem, Yuji Gendai et al. have proposed "AN 8 b 500 MHz ADC" in 1991 $IEEE$ $International$ $Solid$ $State$ $Circuits$ $Conference$, which utilizes a differentiator to detect a transient point in a thermal code, and two encoders to average the detected results. However, while Gendai's circuit may be quite suited to dealing with those bubble errors whose occurrence is predictable, it will be unable to deal with bubble errors that occur randomly.

SUMMARY OF THE INVENTION

Therefore, one object of the present invention is to provide an electronic circuit that is able to remove bubble errors occurring in a thermal code, even if these bubble errors occur randomly.

A further object of the present invention is to provide an electronic circuit for removing bubble errors occurring in a thermal code, which rearranges the thermal code before binary coding.

The present invention achieves the above-indicated objects by providing a circuit for removing bubbles occurring in a thermal code in parallel form. The circuit created by way of the present invention comprises a rotator and a shift register. The rotator is used to convert the thermal code into a serial thermal code. Therefore, the data bits in the thermal code can be read serially at the output of the rotator. The shift register is utilized to receive the serial thermal code and output a corrected thermal code in parallel form in response to the logic states of the serial thermal code. Accordingly, the corrected thermal code has no bubbles.

Moreover, the above-indicated objects can be achieved by providing a circuit for removing bubbles occurring in a thermal code in parallel form, wherein the said thermal code is comprised of a plurality of data bits. The circuit based on the present invention comprises: a sequential pulse generator, a bit selector, and a shift register. The sequential pulse generator is used to generate sequential pulses to input to the bit selector. The bit selector receives the thermal code and sequentially outputs data bits of the thermal code to form a serial thermal code in response to the sequential pulses. However, the shift register receives the serial thermal code and outputs a corrected thermal code in parallel form in response to logic states of said serial thermal code. Accordingly, the corrected thermal code has no bubbles.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

The present invention is suited to rearranging a thermal code so as to eliminate bubble errors by converting the thermal code from a spatial code into a temporal code, and then from the temporal code into another spatial code. Accordingly, the thermal code can be corrected to avoid nonlinear distortion. In the interest of simplification, (XXX XX)p hereafter refers to a code in parallel form, and (XXX XX)s refers to a code in serial form.

Figure 1:
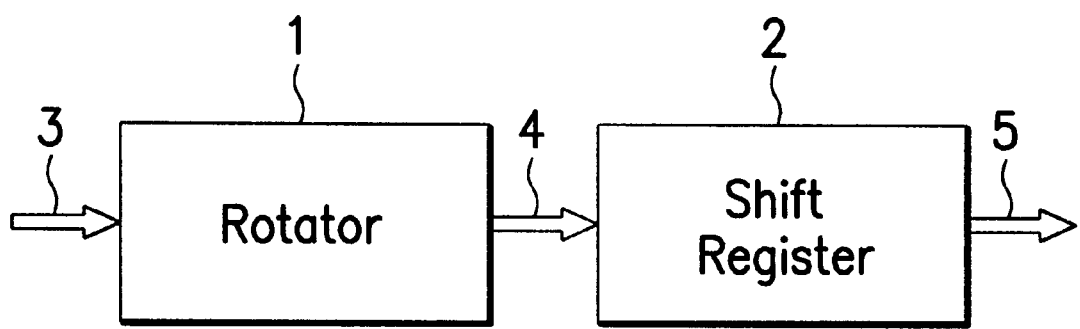
FIG. 1 schematically depicts the circuit diagram of one preferred embodiment in accordance with the present invention.

Referring to FIG. 1, the circuit diagram of one preferred embodiment of the present invention is schematically illustrated. In the drawing, the electronic circuit for removing bubble errors in accordance with the present invention comprises a rotator (1) and a shift register (2) Reference numeral 3 represents a thermal code formed by the outputs of the associated comparators (not shown in the drawing).

The thermal code 3 is comprised of a plurality of data bits inputting into the rotator 1 in parallel form. The rotator 1 is used to convert the data bits of the thermal code 3 available in parallel into a serial thermal code 4. In other words, the data bits can be read serially at the output of the rotator 1. Therefore, the rotator 1 is also entitled "parallel-to-serial converter" or "spatial-to-temporal converter". The serial thermal code 4 is sent to the shift register 2 to remove the bubble errors in response to the logic state of the serial thermal code 4, which is converted into a corrected thermal code 5 in parallel form.

The example used herein is that of a 9-bit thermal code, but this is not intended to limit in any way the scope of the invention, which is naturally suited to any n-bit thermal code for which n is a positive integer.

Normally, the thermal code 3 coming from the outputs of the associated comparators has only one transient point; that is, patterns of all logic-highs, all logic-lows, or a portion of successive logic-highs (1s) and another portion successive logic-lows (0s) are all feasible. Assuming that the thermal code 3 suffers from bubble errors due to noise interference or process variation, the resulting thermal code is (001011011)p. The fourth bit set to logic-low occurs abnormally between the third bit and the fifth bit, both of which are set to logic-high. In addition, the seventh bit set to logic-low abnormally positioned between the sixth bit and the eighth bit, both of which are set to logic-high. Consequently, the fourth bit and the seventh bit involve bubble errors occurring to the thermal code 3.

To remove the bubble errors, the thermal code 3 is applied in parallel to the rotator 1 for processing as depicted in FIG. 1. Because the rotator 1 is a parallel-in serial-out converter, data bits of the thermal code 3 present the code, say (001011011)s, in serial, and the code can be read at the output of the rotator 2; it is the serial thermal code 4 as depicted in FIG. 1. The serial thermal code 4 is thereafter applied to the shift register 2 to remove the bubble errors. In accordance with the present invention, the shift register 2 outputs the corrected thermal code 5 with one pattern of all logic-highs, all logic-lows, or a portion of successive logic-highs (1s) and another portion of successive logic-lows (0s) in response to the logic-highs in the serial thermal code 4. In other words, the number of logic-highs in the corrected thermal code 5 is equal to that of the number of logic-highs in the serial thermal code 4, but all bubbles are removed. As to the aforementioned serial thermal code 4, (001011011)s, the number of data bits being logic-high is five, and therefore the shift register 2 outputs the corrected thermal code 5 being (000011111)p in parallel form. Moreover, if the serial thermal code 4 is (010101111)s, the corrected thermal code 5 will be (000111111)p.

Figure 2:
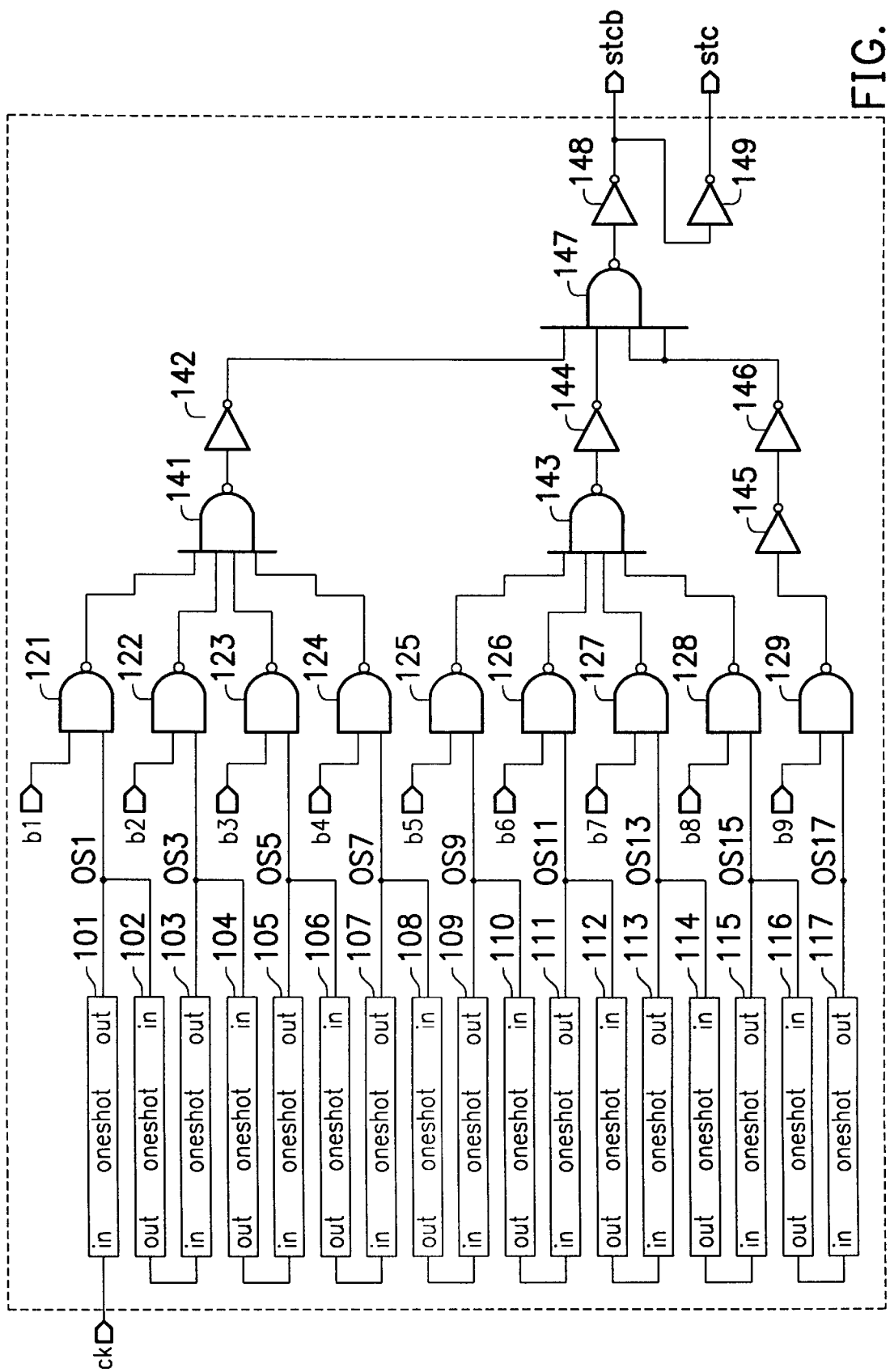
FIG. 2 schematically depicts the circuit diagram of one example of the rotator shown in FIG. 1.

Referring to FIG. 2, the circuit diagram of one example of the rotator 1 depicted in FIG. 1 is schematically illustrated. For example, a 9-bit thermal code 3 is available in parallel form so that b1 represents the first bit of the thermal code 3, b2 the second bit of the thermal code 3, etc. The aim is to sequentially output the selected bit by means of the rotator 1 so that b1, b2, b3, b4, b5, b6, b7, b8 and b9 are sequentially conveyed to the shift register 2. In this example, the rotator 1 comprises a sequential pulse generator 10 and a bit selector 12.

In the drawing, the sequential pulse generator 10 is comprised of seventeen (2n-1) one-shots 101–117 connected in serial. In such a way, the output of the first one-shot 101 is tied to the input of the second one-shot 102, the output of the second one-shot trigger 102 is electrically connected to the input of the third one-shot trigger 103, etc. However, a clock signal ck is applied to the input of the first one-shot 101. All one-shots 101–117 are edge-triggered. When the clock signal ck goes from logic-high to logic-low, the first one-shot 101 is triggered to output logic-high for the first interval $T_1$. For the same reason, the second one-shot 102 is thereafter triggered to output logic-high for the second interval $T_2$ while the output of the first one-shot 101 goes from logic-high to logic-low, the third one-shot 103 is triggered to output logic-high for the third interval $T_3$ while the output of the second one-shot 102 goes from logic-high to logic-low, etc. Preferably, the time intervals $T_1$–$T_{17}$ are substantially the same.

Figure 3:
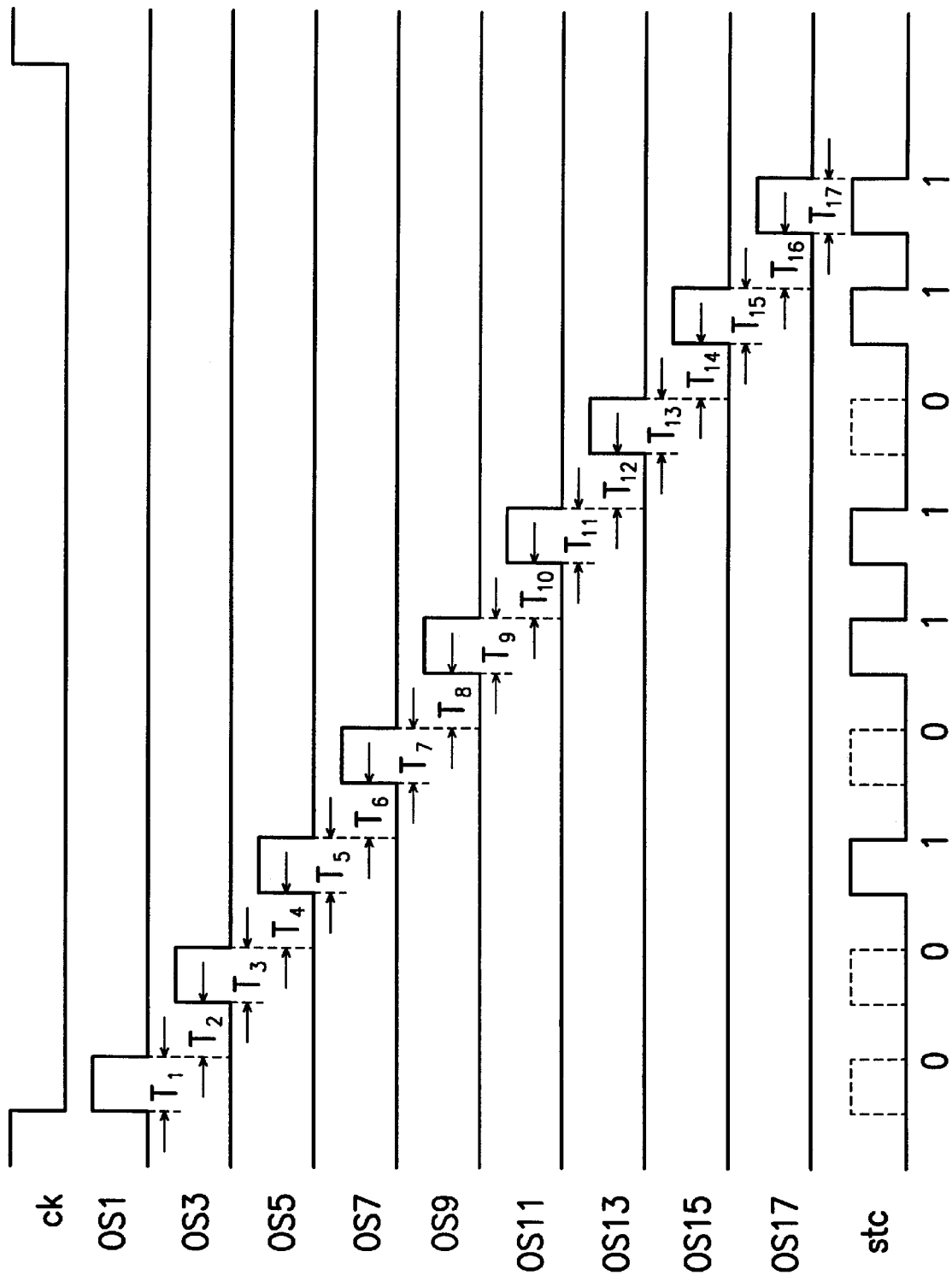
FIG. 3 illustrates the timing diagram of FIG. 2.

In this example, only odd-numbered one-shots such as 101, 103, 105, 107, 109, 111, 113, 115, and 117 are used to convey the pulse signals to the bit selector 12. The outputs of the odd-numbered one-shots such as 101, 103, 105, 107, 109, 111, 113, 115, and 117 are referred to as os1, os3, os5, os7, os9, os11, os13, os15, and os17 respectively. The waveforms of os1, os3, os5, os7, os9, os11, os13, os15, and os17 are shown in FIG. 3.

Further referring to FIG. 2, the bit selector 12 comprises nine (n) two-input NAND gates 121–129, three four-input NAND gates 141, 143, 147, six inverters 142, 144, 145, 146, 148, 149, and so on. The inputs of the NAND gate 121 are b1 and os1, the inputs of the NAND gate 122 are b2 and os3, the inputs of the NAND gate 123 are b3 and os5, the inputs of the NAND gate 124 are b4 and os7, the inputs of the NAND gate 125 are b5 and os9, the inputs of the NAND gate 126 are b6 and os11, the inputs of the NAND gate 127 are b7 and os13, the inputs of the NAND gate 128 are b8 and os15, and the inputs of the NAND gate 129 are b9 and os17. The outputs of the NAND gates 121–124 serve as the inputs of the NAND gate 141, and the outputs of the NAND gates 125–128 serve as the inputs of the NAND gate 143. Moreover, each output of the NAND gates 141 and 143 is applied to the NAND gate 147 by the inverter 142 and 144, respectively. In addition, the output of the NAND gate 129 is coupled to the NAND gate 147 through the pair of inverters 145 and 146. The inverter 148 performs the operation of logic negation, which inverts the sense of its output stcb with respect to the output of the NAND gate 147, while the inverter 149 performs one more operation of logic negation and thereby forms another output stc. In a word, stcb is the complement of stc.

The operation of the rotator 1 will be described as follows. Referring to FIGS. 2 and 3, by means of the sequential pulse generator 10, it is possible to send out sequential pulses so that it appears at os1 for the first interval $T_1$, os2 for the third interval $T_3$, os3 for the fifth interval $T_5$, os4 for the seventh interval $T_7$, os5 for the ninth interval $T_9$, os6 for the eleventh interval $T_{11}$, os7 for the thirteenth interval $T_{13}$, os8 for the fifteenth interval $T_{15}$, and os9 for the seventeenth interval $T_{17}$. With such excitation of the associated pulses, the output stc will be b1 for the first interval $T_1$, b2 for the third interval $T_3$, b3 for the fifth interval $T_5$, b4 for the seventh interval $T_7$, b5 for the ninth interval $T_9$, b6 for the eleventh interval $T_{11}$, b7 for the thirteenth interval $T_{13}$, b8 for the fifteenth interval $T_{15}$, and b9 for the seventeenth interval $T_{17}$. If the thermal code 3 with bubble errors is (001011011)p, the serial thermal code 4 appearing at the output stc of rotator 1 will be (001011011)s as shown in FIG. 3, wherein the dotted lines refer to the time intervals for the corresponding data bits which are logic-low.

Figure 4:
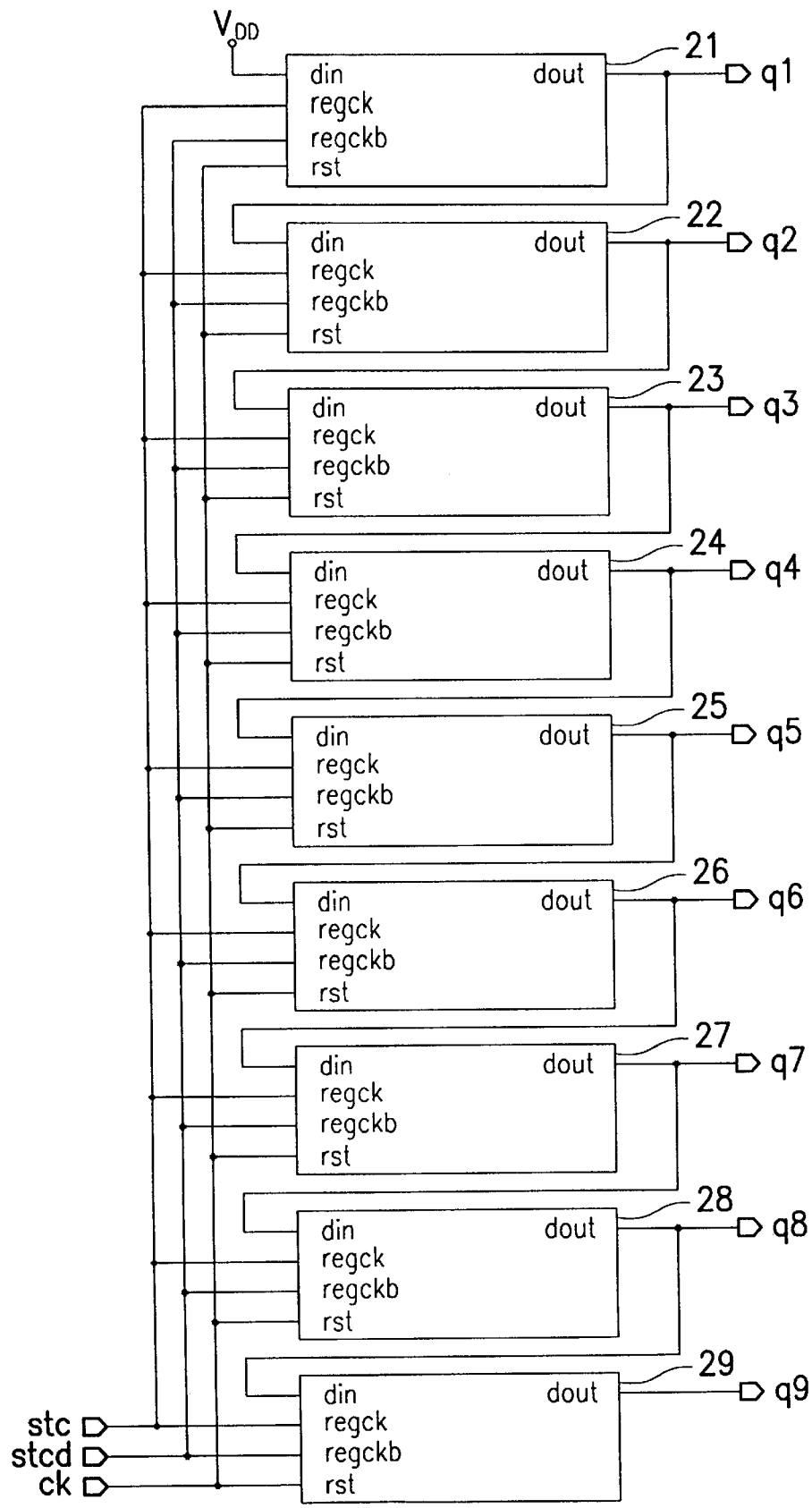
FIG. 4 schematically depicts the circuit diagram of one example of the shift register shown in FIG. 1.

Referring to FIG. 4, the circuit diagram of one example of the shift register 2 depicted in FIG. 1 is schematically illustrated. As to the application of the 9-bit thermal code, nine (n) registers 21–29 are required to implement the shift register 2. Each of the registers 21–29 has a data input din, a data output dout, a clock input regck, and a reset input rst, while another clock input regckb serves as the complement of regck. As shown in FIG. 4, the registers 21–29 are connected in serial so that the data output of the first register 21 is tied to the data input of the second register 22, the data output of the second register 22 is tied to the data input of the third register 23, the data output of the third register 23 is tied to the data input of the fourth register 24, the data output of the fourth register 24 is tied to the data input of the fifth register 25, the data output of the fifth register 25 is tied to the data input of the sixth register 26, the data output of the sixth register 26 is tied to the data input of the seventh register 27, the data output of the seventh register 27 is tied to the data input of the eighth register 28, and the data output of the eighth register 28 is tied to the data input of the ninth register 29. Note that the data input of the first register 21 is connected to a voltage source $V_{DD}$ referring to logic-high. Moreover, the outputs of the registers 21–29 are referred to as q1, q2, q3, q4, q5, q6, q7, q8, and q9, respectively, which form the corrected thermal code 5. The clock signal ck as mentioned in FIG. 2 is also applied to the reset input rst for each of the registers 21–29, while the outputs stc and stcb of the rotator 1 are applied to regck and regckb for each of the registers 21–29, respectively.

The operation of the shift register 2 will be described as follows. All registers 21–29 are cleared to be logic-low by the clock signal ck applying a logic-high to all rst inputs. Then, the output stc of the rotator is simultaneously applied to the regck inputs of the register 21–29. In view of each of the registers 21–29, the state of data input din will be entered and transferred to the data output dout when the associated clock input regck changes from logic-low to logic-high, but does not change the state between pulses. Accordingly, beginning from register 21, a logic-high state will be successively transferred to the data outputs dout of the registers 21–29 in response to the logic-high appearing at the output stc of the rotator 1.

Taking a serial thermal code 4, say (001011011)s, as an example, q1, q2, q3, q4, q5, q6, q7, q8, and q9 are respectively set to 1,0,0,0,0,0,0,0,0 during the fifth interval $T_5$, 1,1,0,0,0,0,0,0,0 during the ninth interval $T_9$, 1,1,1,0,0,0,0,0,0 during the eleventh interval $T_{11}$, 1,1,1,1,0,0,0,0,0 during the fifteenth interval $T_{15}$, and 1,1,1,1,1,0,0,0,0 during the seventeenth interval $T_{17}$. Accordingly, the associated outputs q9, q8, q7, q6, q5, q4, q3, q2, and q1 of the shift registers 21–29 form the corrected thermal code 5 which has no bubble errors. Thereafter, a priority encoder may be provided to convert the corrected thermal code 5 into a binary code or a binary-coded-decimal (BCD) code for further processing.

In conclusion, the electronic circuit for removing bubble errors transfers the thermal code from spatial domain to time domain, and then from the time domain to the spatial domain. In accordance with the present invention, the rotator and the shift register are used to implement the circuit. The rotator is utilized to convert the data bits of the thermal code available in parallel into the serial thermal code. In other words, the data bits can be read serially at the output of the rotator. However, the serial thermal code is applied to the shift register for removing the bubble errors in response to the logic state in the serial thermal code and by converting the serial thermal code into the corrected thermal code in parallel form. Accordingly, the electronic circuit for removing bubble errors developed in accordance with the present invention can eliminate bubble errors occurring in the thermal code even if the bubbles occur randomly.

The foregoing description of preferred embodiments of the present invention has been provided for the purposes of illustration and description. It is not intended to be exhaustive or to limit the invention to the precise forms disclosed. Many modifications and variations will be apparent to practitioners skilled in the art. The embodiments were chosen and described to best explain the principles of the invention and its practical application, thereby enabling others skilled in the art to understand the invention, to practice various other embodiments, and to make various modifications suited to the particular uses contemplated. It is intended that the scope of the invention be defined by the following claims and their equivalents.

What is claimed is:

1. A circuit for removing bubbles occurring in a thermal code in parallel form, comprising:

a rotator converting said thermal code into a serial thermal code; and a shift register comprising a plurality of registers connected in series, receiving said serial thermal code and outputting a corrected thermal code in parallel form without the said bubbles, wherein said serial thermal code is applied to a clock input of each of said registers.

2. The circuit as claimed in claim 1, wherein the said thermal code is comprised of a plurality of data bits.

3. The circuit as claimed in claim 2, wherein said rotator comprises:

a sequential pulse generator sending out sequential pulses; and a bit selector receiving said data bits and sequentially outputting said data bits in response to said sequential pulses.

4. The circuit as claimed in claim 3, wherein said sequential pulse generator comprises a plurality of one-shots connected in series.

5. The circuit as claimed in claim 3, wherein said bit selector is implemented by combinational logic elements.

6. A circuit for removing bubbles occurring in a thermal code in parallel form, wherein said thermal code is comprised of a plurality of data bits, said circuit comprising:

a sequential pulse generator sending out sequential pulses;

a bit selector receiving said data bits and sequentially outputting said data bits to form a serial thermal code in response to said sequential pulses; and a shift register comprising a plurality of registers connected in series, receiving said serial thermal code and outputting a corrected thermal code in parallel form without said bubbles, wherein said thermal code is applied to a clock input of each of said registers.

7. The circuit as claimed in claim 6, wherein said sequential pulse generator comprises a plurality of one-shots connected in series.

8. The circuit as claimed in claim 6, wherein said bit selector is implemented by combinational logic elements.

* * * * *